United States Patent [19]
Nishimura

[11] Patent Number: 5,306,937
[45] Date of Patent: Apr. 26, 1994

[54] SEMICONDUCTOR DEVICE HAVING A BUILT-IN CURRENT-SENSING DIODE

[75] Inventor: Takeyoshi Nishimura, Matsumoto, Japan

[73] Assignee: Fuji Electric Co., Ltd., Kawasaki, Japan

[21] Appl. No.: 945,719

[22] Filed: Sep. 16, 1992

[30] Foreign Application Priority Data

Sep. 17, 1991 [JP] Japan .................... 3-235209

[51] Int. Cl.$^5$ .................... H01L 29/10; H01L 27/02
[52] U.S. Cl. .................... 257/328; 257/335; 257/337; 257/570
[58] Field of Search ............... 257/328, 335, 337, 570

[56] References Cited

U.S. PATENT DOCUMENTS

| | | | |
|---|---|---|---|
| 3,971,055 | 7/1976 | Arai | 357/22 |
| 4,106,048 | 8/1978 | Khajezadeh | 357/40 |
| 4,492,972 | 1/1985 | Gorecki | 357/22 |

FOREIGN PATENT DOCUMENTS

| | | |
|---|---|---|
| 0410911 | 1/1991 | European Pat. Off. |
| 4024728 | 2/1991 | Fed. Rep. of Germany |

*Primary Examiner*—Mark V. Prenty
*Attorney, Agent, or Firm*—Brumbaugh, Graves, Donohue & Raymond

[57] ABSTRACT

The present invention to a semiconductor switching device for use in semiconductor converter devices, which switching device has a built-in current sensor to detect the current flowing into parasitic diodes integrally formed as part of the semiconductor switching device. Detection of the parasitic-diode current is useful for adjusting the switching timing for a commutation, which in turn allows reduction in switching loss. The parasitic diodes consist of a first region of a first conductivity type serving as a semiconductor substrate, and a second region of a second conductivity type formed in a first surface portion of the first region. A third region of the same conductivity type, impurity concentration and depth as the second region is formed in the surface layer of the first region. When current flows through the parasitic diode, a current corresponding to the parasitic-diode current flows through the sensing diodes consisting of the first and the third regions. The sensing-diode current is drawn out and measured from the electrode making contact with the third region, thereby making it possible to determine the current flowing through the parasitic diodes.

13 Claims, 5 Drawing Sheets

SEMICONDUCTOR DEVICE HAVING A BUILT-IN CURRENT-SENSING DIODE

BACKGROUND OF THE INVENTION

The present invention relates to a semiconductor device, and particularly to a semiconductor switching device for a semiconductor converter device, which switching device has a built-in, current-sensing diode to measure the parasitic-diode current.

In a semiconductor converter device, it is generally known that when generating a shift in electric current, or a commutation among the device elements, by switching the constituent semiconductor switching device, is desirable to determine the optimal timing of the switching in order to reduce the switching loss. The timing of the switching is determined by detecting the current flowing in parasitic diodes integrally formed in the semiconductor substrate of the semiconductor switching device. In the case of a voltage-driven, MOS-type semiconductor device, the parasitic diodes consist of a region of the first conductivity type and a channel region of the second conductivity type formed in the surface portion of the region of the first conductivity type. In the case of a current-driven, bipolar-type semiconductor element, the parasitic diodes consist of a region of the first conductivity type and the base region of the second conductivity type formed in the surface portion of the region of the first conductivity type.

It is also well known that detecting a current flow in the parasitic diodes is quite difficult. Consequently, the conventional method of adjusting the switching timing has been to confirm the timing with a circuit external to the semiconductor elements. However, confirming the switching timing by actually assembling an external circuit requires much time and expense.

A first object of the present invention is to provide a semiconductor element that can easily detect a current flowing in the parasitic diodes existing internally to the semiconductor substrate of the switching device.

A second object of the present invention is to provide a semiconductor switching device for a semiconductor converter device which is capable of achieving switching operations with only half the losses of the conventional semiconductor converter devices.

SUMMARY OF THE INVENTION

To achieve the above objectives, the present invention incorporates sensing diodes within the semiconductor device to detect the current flowing through the parasitic diodes, thereby facilitating adjustment of the switching timing for commutation. The sensing diodes are integrally formed in the same semiconductor substrate as the semiconductor switching device. The parasitic-diode current is measured from a separate electrode which is positioned away from the parasitic diode and connected to the sensing diodes.

The present invention encompasses both a MOS-type semiconductor device and a bipolar-type semiconductor devices. For both types of devices, a first region of first conductivity type is formed as a semiconductor substrate, and a second region of a second conductivity type is formed selectively in a first surface portion of the first region. A third region with the same conductivity type, impurity concentration and depth as the second region is formed selectively on the first surface portion of the semiconductor substrate. In addition, an electrode making contact at least with the second region is disposed on the surface of the semiconductor substrate, while another electrode that makes contact with the third region is disposed on the first surface portion of the semiconductor substrate.

In the case of a MOS-type semiconductor device, a fourth region of the first conductivity type is additionally formed on the surface portion of the second region, and gate electrodes are disposed via an insulation film on the portion of the second region located between the first region and the fourth region. In addition, a main electrode that commonly makes contact with the first region and the third region are provided on the second surface of the first region serving as the substrate.

For a MOS-type device, when an electric current starts flowing through the parasitic diodes consisting of the first region and the second region, a current corresponding to the aforementioned parasitic-diode current begins to flow in the sensing diodes consisting of the third region and the first region. The third region has the same conductivity type, impurity concentration and depth as in the second region. By measuring the sensing-diode current from an electrode independent of the electrode for the actual semiconductor switch segment of the device, it is possible to detect the current flowing in the parasitic diodes, thereby making it possible to determine the switching timing. The current operating the actual MOS-type semiconductor switch segment of the device does not flow into the sensing diodes, and therefore has no effect whatsoever on the detection of current flow in the parasitic diodes.

For a bipolar-type semiconductor device, an electrode making contact with the first region of the device is disposed on the second surface of the first region, and another electrode making contact with the second region is disposed on the surface of the semiconductor substrate. These two electrodes serve as the cathode and anode electrodes for the sensing diodes.

When an electric current starts flowing in the parasitic diodes consisting of the first region and the second region, a current corresponding to the aforementioned parasitic-diode current begins to flow in the sensing diodes formed by the third region and the first region. The third region has the same conductivity type, impurity concentration and depth as those for the second region. By taking out and measuring the sensing-diode current from an electrode independent from the electrode for the actual semiconductor switch segment of the device, it is possible to detect the current flowing in the parasitic diodes, thereby enabling the switching timing to be determined.

DETAILED DESCRIPTION OF THE EMBODIMENTS

Figure 3:
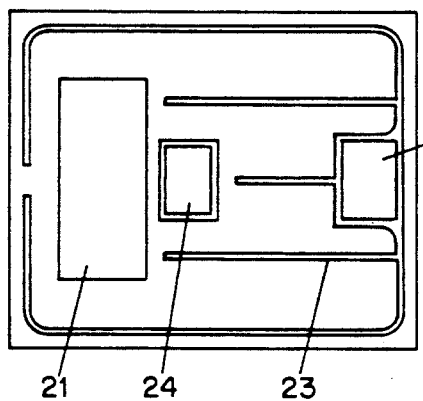
FIG. 3 is a plan view of a vertical MOSFET chip according to a second embodiment of the present invention.
Figure 4:
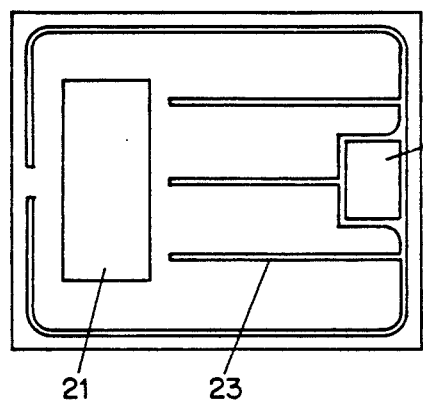
FIG. 4 is a plan view of a conventional vertical MOSFET chip.

FIG. 3 is a plan view of a vertical-type MOSFET device according to one embodiment of the present invention. FIG. 4 is a plan view of a conventional vertical-type MOSFET device shown for the purpose of comparison. In both figures, a source pad 21 connected to a source electrode, and a gate pad 22 connected to a gate electrode via a gate runner 23, are provided on the device surface. In the FIG. 3 device, a parasitic diode sensing pad 24 is provided in addition to the above components.

Figure 1:
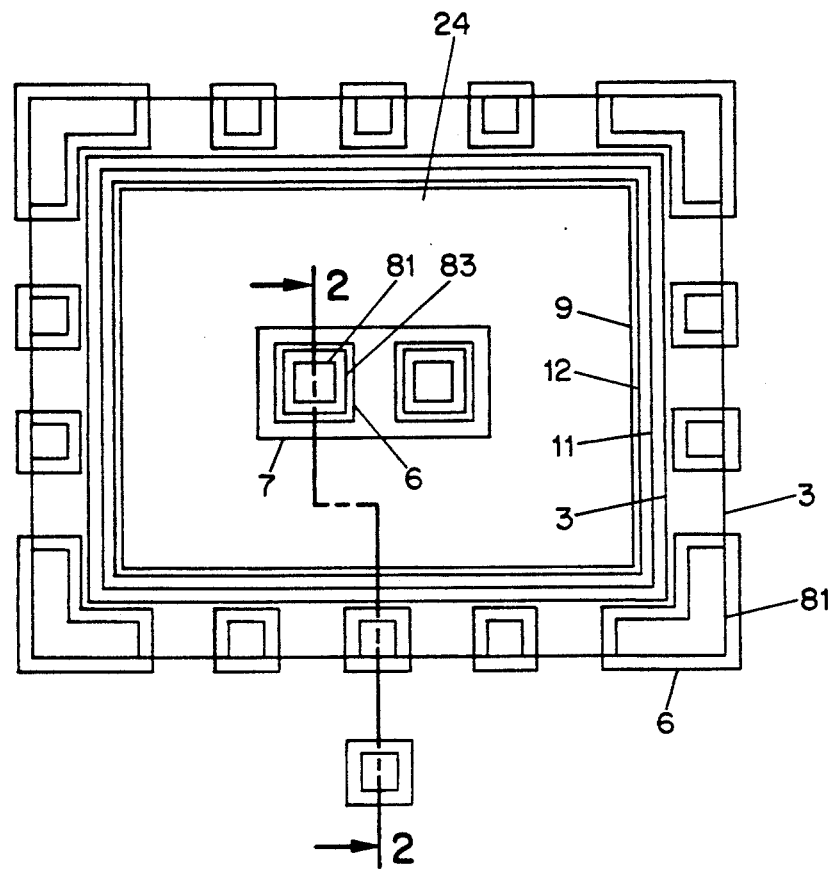
FIG. 1 is a plan view of a vertical-type MOSFET according to a first embodiment of the present invention.
Figure 2:
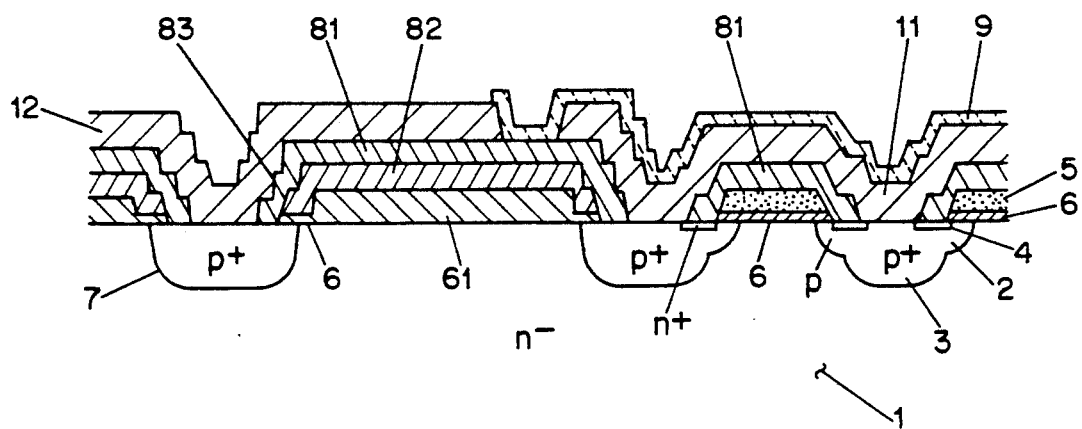
FIG. 2 is a cross-sectional taken along line 2—2 in FIG. 1.

FIGS. 1 and 2 show the construction of the device in vicinity of the parasitic diode sensing pad 24. As shown in FIG. 2, the MOSFET cell located around the parasitic diode sensing pad 24 is constructed such that a p-type channel region 2 is selectively formed on a first surface portion of an $n^-$-type silicon substrate 1. A $p^+$-type region 3 is formed at the first surface portion of the substrate 1, and $n+$ source regions 4 are selectively formed at the surface portion of the region 3. A gate electrode 5, laterally extending from the exposed surface portion of the substrate 1 to the portion of the p-region 2 sandwiched between the $n+$ source region 4 and the surface portion of the substrate 1, is disposed on the semiconductor layers via a gate oxide film 6.

The $n^-$ substrate 1 and a $p+$ anode region 7, which is formed simultaneously with the $p+$ region 3, form the sensing diode. A thick field oxide film 61 is disposed on the surface portion of the substrate 1, laterally separating the MOSFET section from the region 7. The source electrode 11, commonly making contact with the $p+$ region 3 and the $n+$ source region 4, is insulated by the gate oxide film 6 and a polysilicon gate ("PSG") film 81.

Over the field oxide film 61, an insulation layer 82 is provided beneath the PSG film 81 which insulates an anode electrode 12. The anode electrode 12, which makes contact with the anode region 7, is formed by Al deposition as in the case of the source electrode 11. A parasitic-diode sensing pad 24 is formed on the face extended from this anode electrode 12. In addition, a SiN film 9 is deposited on the MOSFET cell for the purpose of passivation. Measuring the current flowing between the $p+$-anode region 7 and the $n^-$-substrate 1 by using the anode electrode 12 and a main electrode for the MOSFET, which main electrode is not shown in FIG. 2, enables the detection of the current flowing into the parasitic diodes consisting of the $p+$-region 3 and the $n^-$-substrate 1.

Figure 5:
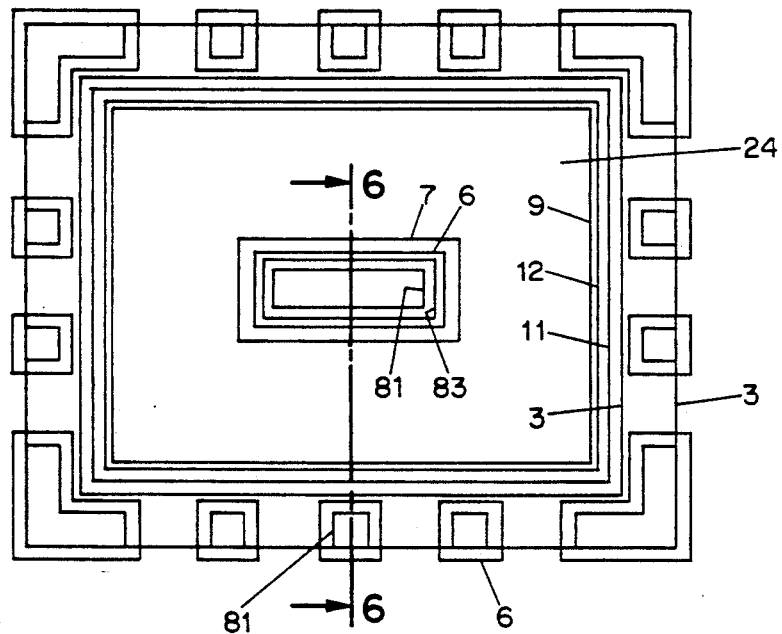
FIG. 5 is a plan view of a vertical-type MOSFET according to third embodiment of the present invention.
Figure 6:
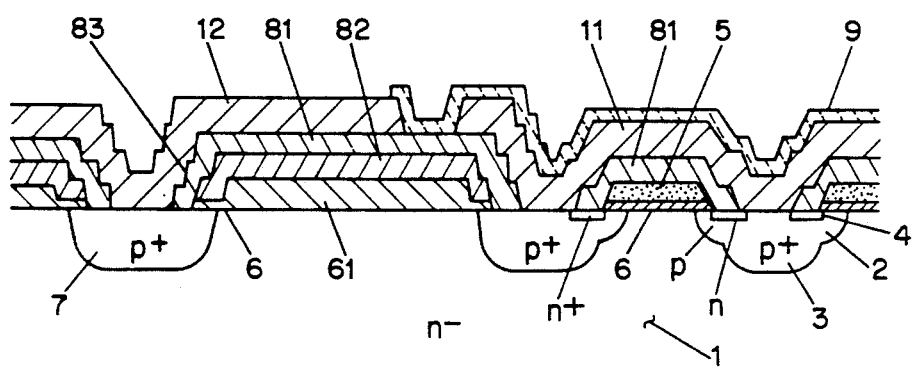
FIG. 6 is a cross-sectional view taken along line 6—6 in FIG. 5.
Figure 7:
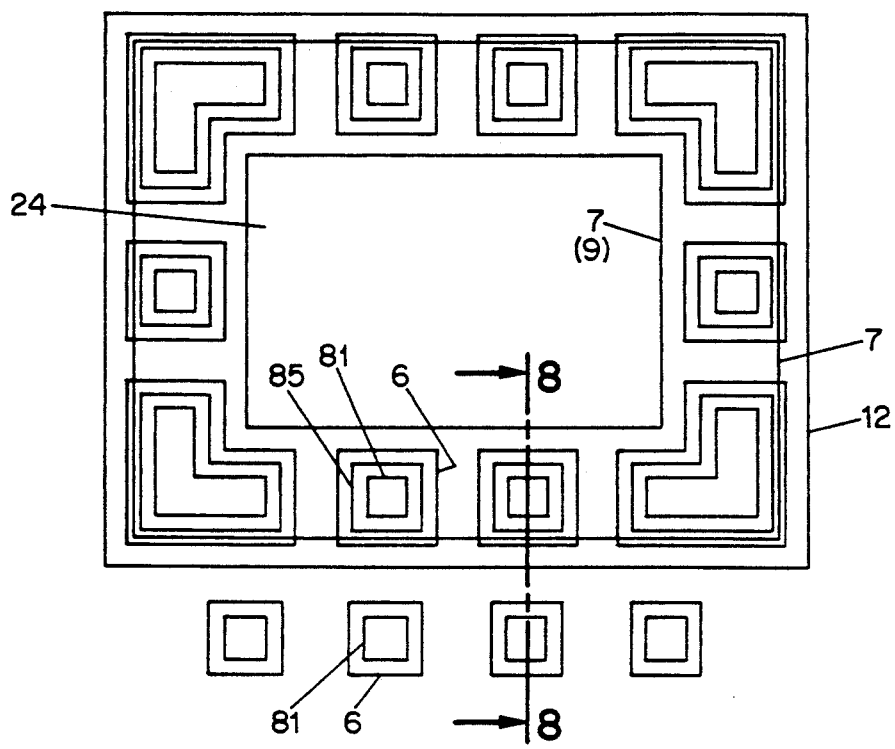
FIG. 7 is a plan view of a vertical-type MOSFET according to a fourth embodiment of the present invention.
Figure 8:
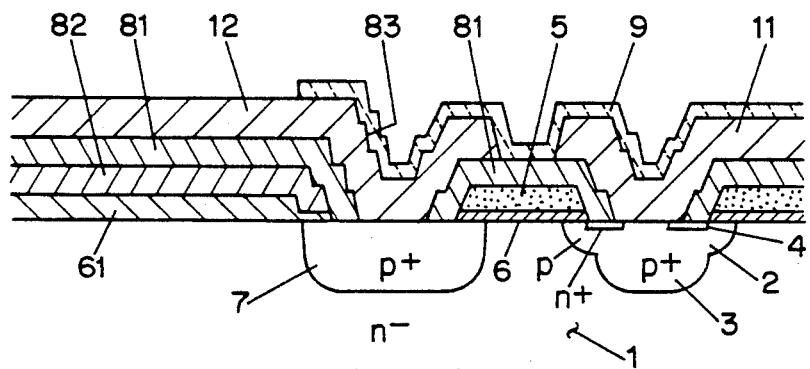
FIG. 8 is a cross-sectional view taken along line 8—8 in FIG. 7.

FIGS. 5 and 6 show the construction in the vicinity of the parasitic diode sensing pad 24 in a vertical MOSFET of another embodiment according to the present invention, the parts common with those in FIG. 1 being given the same numbers. While the FIG. 1 embodiment has two contact holes for the anode region 7, there is only one in this case. In the embodiment for the vertical MOSFET shown in FIGS. 7 and 8, ten contact holes for the anode region 7 are distributed around the sensing pad 24.

Figure 9:
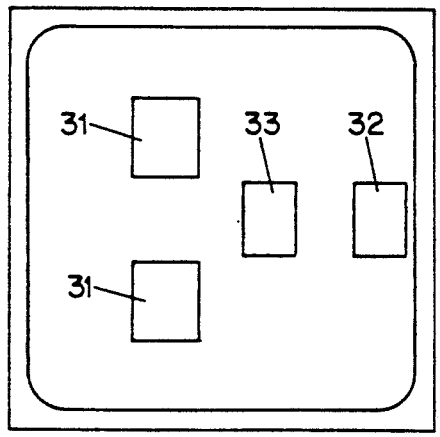
FIG. 9 is a plan view of the bipolar transistor chip according to the embodiment of the present invention.
Figure 10:
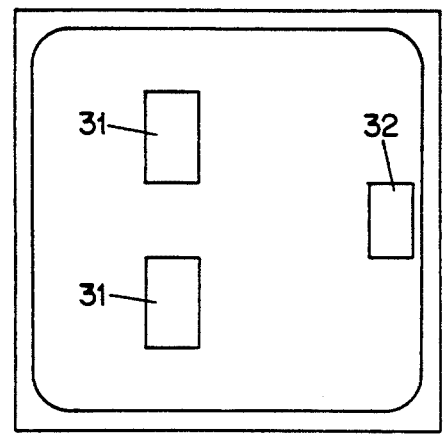
FIG. 10 is a plan view of a conventional bipolar transistor chip.

FIG. 9 is a plan view of another embodiment of the present invention having a mesh-type bipolar structure. FIG. 10 is a plan view of a conventional mesh-type bipolar device shown for the purpose of comparison. In both figures, an emitter pad 31 connected to an emitter electrode, and a base pad 32 connected to a base electrode, are disposed on the device surface. However, in FIG. 9, a parasitic diode sensing pad 33 is provided in addition to the above components.

Figure 11:
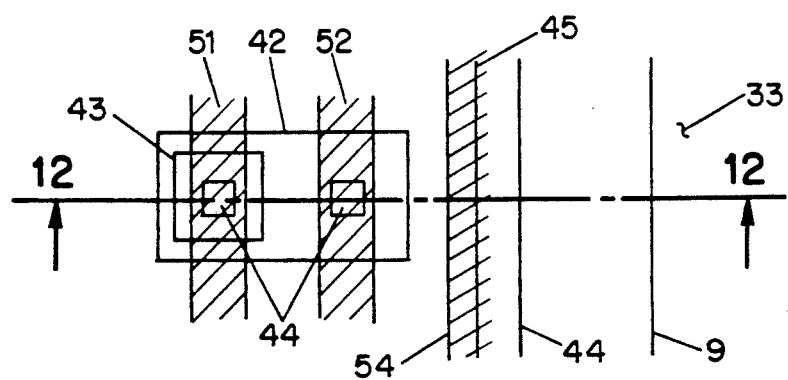
FIG. 11 is a plan view of a bipolar transistor according to one embodiment of the present invention.
Figure 12:
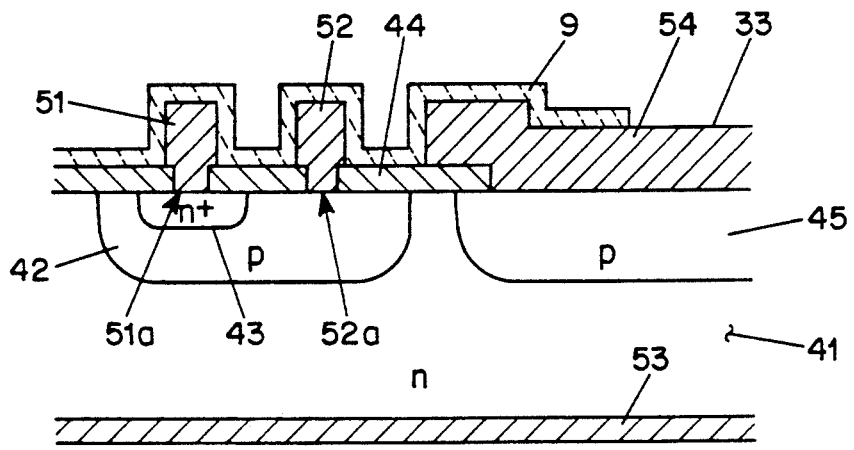
FIG. 12 is a cross-sectional view taken along line 12—12 in FIG. 11.

FIGS. 11 and 12 show the portion of a bipolar device according to the present invention in the vicinity of the parasitic diode sensing pad 33. At the surface portion of p-base regions 42, which regions are selectively formed at the surface portion of the n-type silicon substrate 41, an $n+$-emitter region 43 is in turn formed selectively. The base region 42 and the emitter region 43 contact a base electrode 52 and an emitter electrode 51, respectively, through contact holes 52a and 51a drilled in an oxide film 44 deposited on the surface of the semiconductor elements. These electrodes are covered with the passivation SiN film 9.

Beneath the parasitic diode sensing pad, an anode region 45 for the sensing diode is formed simultaneously with the p-base region. The entire surface of the anode region contacts an anode electrode 54. The electrodes 51, 52 and 54 are formed by patterning the Al deposited films. The top surface of the electrodes are covered by the passivation SiN film 9. The second surface of the substrate 41 contacts a collector electrode 53. This collector electrode serves also as the cathode electrode for the sensing diodes. Measuring the current flowing between the p-anode region 45 and the n-substrate 41 by using the anode electrode 54 and the cathode electrode 53 enables detection of the current flowing into the parasitic diode formed by the p-base region 42 and the n-substrate 41.

Figure 13:
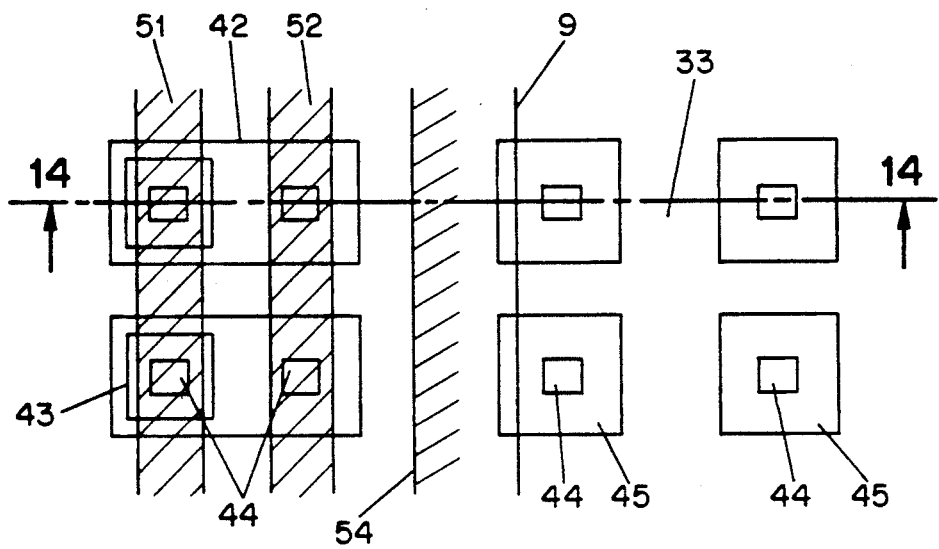
FIG. 13 is a plan view of a bipolar transistor according to another embodiment of the present invention.
Figure 14:
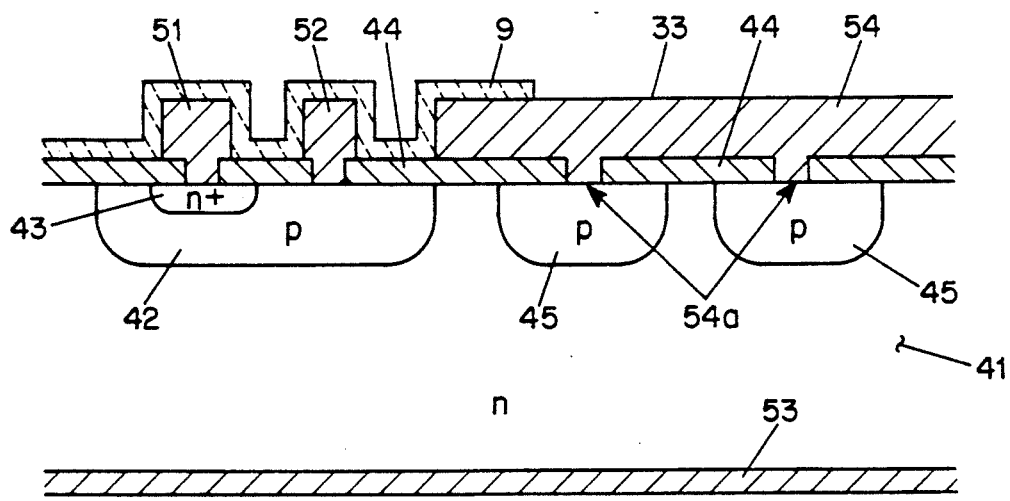
FIG. 14 is a cross-sectional view taken along line 14—14 in FIG. 13.

FIGS. 13 and 14 show the construction in the vicinity of the parasitic diode sensing pad 33 in a bipolar transistor of another embodiment according to the present invention, the parts common with those in FIGS. 11 and 12 being given the same numbers. In this case, the anode region 45 is formed simultaneously with the plural base region 42. The anode region 45 contacts the anode electrode 54 through contact holes 54a drilled in the oxide film 44 deposited on the surface of the semiconductor elements. The parasitic diode sensing pad 33 is disposed on the anode electrode 54.

Figure 15:
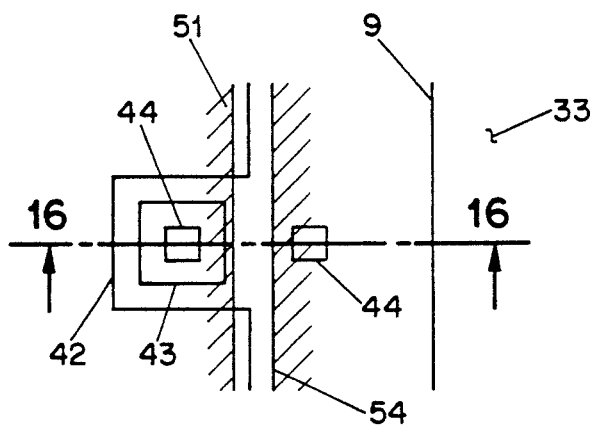
FIG. 15 is a plan view of a bipolar transistor according to still another embodiment of the present invention.
Figure 16:
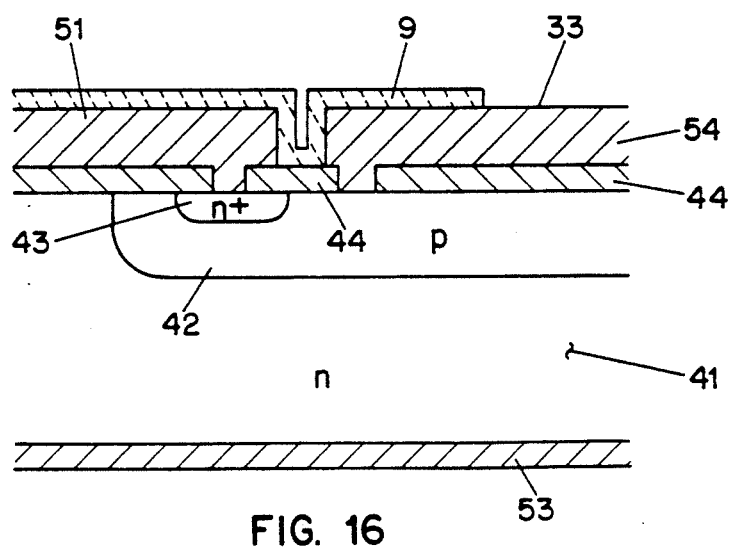
FIG. 16 is a cross-sectional view taken along line 16—16 in FIG. 15.

FIGS. 15 and 16 show a bipolar device of yet another embodiment according to the present invention in which the anode region is formed on the extended portion of the base region 42. The anode electrode 54 makes contact with the base region 42 at a position close to the transistor section of the device.

According to the present invention, the current into the parasitic diodes to be detected for the purpose of adjusting the switching timing for commutation can be detected by means of forming sensing diodes of the same configuration on the same semiconductor substrate, and taking out and measuring the current from another electrode connected to the sensing diodes. This type of arrangement makes it possible to determine the switching timing which minimizes loss.

It will be readily apparent to those skilled in the art that while the present invention has been explained in reference to the above embodiments, the present invention is not limited to such embodiments. The present invention can also be implemented with other MOS-type semiconductor devices, such as an IGBT, or with other bipolar-type semiconductor devices.

I claim:

1. A semiconductor device comprising:
   a semiconductor substrate first region of a first conductivity type having first and second surfaces;
   a second region of a second conductivity type selectively formed in a portion of the first surface of the first region;
   an electrode disposed over the first and second regions, the electrode making contact with at least the second region;
   a third region formed selectively on a portion of the first surface of the first region, the third region having the same conductivity type, impurity concentration and depth as the second region;
   a second electrode disposed over the first and third regions, the second electrode making contact with the third region; and
   a third electrode making contact with at least the second surface of the first region;
   wherein portions of the first and third regions form a sensing diode for detecting current flow in a parasitic diode consisting of portions of the first and second regions, and current through the sensing diode is measured using the second electrode.

2. A semiconductor device as in claim 1, further comprising a parasitic-diode-sensing pad disposed on the second electrode and contacting at least one discrete portion of the second electrode.

3. A semiconductor device as in claim 1, further comprising a fourth region of the first conductivity type formed on a surface portion of the second region.

4. A semiconductor device as in claim 3, further comprising gate electrodes disposed via an insulation film on the portion of the second region located between the first region and the fourth region.

5. A semiconductor device as in claim 4, further comprising a parasitic-diode-sensing pad disposed on the second electrode and contacting at least one discrete portion of the second electrode.

6. A semiconductor device as in claim 3, further comprising a fourth electrode contacting the fourth region.

7. A semiconductor device as in claim 6, further comprising a parasitic-diode-sensing pad disposed on the second electrode and contacting at least one discrete portion of the second electrode.

8. A semiconductor device as in claim 1, wherein the third electrode commonly contacts the first region and the second region.

9. A semiconductor device as in claim 8, further comprising a fourth region of the first conductivity type formed on a surface portion of the second region.

10. A semiconductor device as in claim 9, further comprising a parasitic-diode-sensing pad disposed on the second electrode and contacting at least one discrete portion of the second electrode.

11. A semiconductor device as in claim 9, further comprising gate electrodes disposed via an insulation film on the portion of the second region located between the first region and the fourth region.

12. A semiconductor device as in claim 11, further comprising a parasitic-diode-sensing pad disposed on the second electrode and contacting at least one discrete portion of the second electrode.

13. A semiconductor device comprising:
   a semiconductor substrate first region of a first conductivity type having first and second surfaces;
   a second region of a second conductivity type selectively formed in a portion of the first surface portion of the first region;
   an electrode disposed over the first and second regions, the electrode making contact with at least the second region;
   a third region formed selectively on a portion of the first surface of the first region, the third region having the same conductivity type, impurity concentration and depth as the second region;
   a second electrode disposed over the first and third regions, the second electrode making contact with the third region;
   a parasitic-diode-sensing pad disposed on the second electrode and contacting at least one discrete portion of the second electrode;
   a third electrode contacting the second surface of the first region;
   a fourth region of the first conductivity type formed on a surface portion of the second region; and
   gate electrodes disposed via an insulation film on the portion of the second region located between the first region and the fourth region;
   wherein portions of the first and third regions form a sensing diode for detecting current flow in a parasitic diode consisting of portions of the first and second regions, and current through the sensing diode is measured using the second electrode.

* * * * *